(12) United States Patent
Lin et al.

(10) Patent No.: US 9,184,200 B2
(45) Date of Patent: Nov. 10, 2015

(54) INFRARED REFLECTION/ABSORPTION LAYER FOR REDUCING GHOST IMAGE OF INFRARED REFLECTION NOISE AND IMAGE SENSOR USING THE SAME

(71) Applicant: OmniVision Technologies, Inc., Santa Clara, CA (US)

(72) Inventors: Wei-Feng Lin, HsinChu (TW); Yeh-An Chien, HsinChu (TW); Chun-Sheng Fan, HsinChu (TW)

(73) Assignee: Omnivision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/696,630

(22) Filed: Apr. 27, 2015

(65) Prior Publication Data
US 2015/0228680 A1    Aug. 13, 2015

Related U.S. Application Data

(62) Division of application No. 13/662,640, filed on Oct. 29, 2012, now Pat. No. 9,111,832.

(51) Int. Cl.
*H01L 27/00* (2006.01)
*H01L 27/146* (2006.01)

(52) U.S. Cl.
CPC ........ *H01L 27/14629* (2013.01); *H01L 27/146* (2013.01); *H01L 27/14607* (2013.01); *H01L 27/14623* (2013.01); *H01L 27/14636* (2013.01); *H01L 27/14649* (2013.01); *H01L 27/14669* (2013.01); *H01L 27/14621* (2013.01); *H01L 27/14627* (2013.01)

(58) Field of Classification Search
CPC .......................... H01L 27/146; H01L 27/1462
USPC ...................... 250/208.1, 214.1, 338.1, 338.4; 257/436, 437
See application file for complete search history.

(56) References Cited

U.S. PATENT DOCUMENTS

| 6,420,691 | B1 | 7/2002 | Loh et al. | |
| 6,775,059 | B2 | 8/2004 | Kuwabara | |
| 7,160,628 | B2 | 1/2007 | Bellman et al. | |
| 2014/0117203 | A1* | 5/2014 | Lin et al. | H01L 27/14629 250/208.1 |

OTHER PUBLICATIONS

Use of Fabry-Perot Anti-Reflection-Layered Structure Enhance Extreme Ultraviolet Light Technology of Micro-? Contrast Shadow Mask Graphic View (No. 47 of Semiconductor Technology, Sep. 2004) Internet website http://tt.acesuppliers.com/tech/tech_1.asp?idxid=402 printed Jan. 29, 2013, with Machine translation, 2002.
U.S. Appl. No. 13/662,640 Select File History dated Jan. 20, 2015 through Apr. 14, 2015, 16 pages.
U.S. Appl. No. 13/662,640 Notice of Allowance issued May 12, 2015, 7 pages.

* cited by examiner

*Primary Examiner* — Kevin Pyo
(74) *Attorney, Agent, or Firm* — Lathrop & Gage LLP

(57) ABSTRACT

An image sensor includes a photosensing element for receiving infrared (IR) radiation and detecting the IR radiation and generating an electrical signal indicative of the IR radiation. A redistribution layer (RDL) is disposed under the photosensing element, the RDL comprising pattern of conductors for receiving the electrical signal. An IR reflection layer, an IR absorption layer or an isolation layer is disposed between the photosensing element and the RDL. The IR reflection layer, IR absorption layer or isolation layer provides a barrier to IR radiation such that the IR radiation does not impinge upon the RDL. As a result, a ghost image of the RDL is not generated, resulting in reduced noise and improved sensitivity and performance of the image sensor.

13 Claims, 11 Drawing Sheets

| Layer No.# | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| Materials | TiO2 | SiO2 | TiO2 | SiO2 | TiO2 | SiO2 | TiO2 | SiO2 | TiO2 | SiO2 | TiO2 | SiO2 | TiO2 | SiO2 | TiO2 | SiO2 | TiO2 | SiO2 | TiO2 |
| Thickness (nm) | 106.95 | 172.36 | 108.13 | 172.62 | 108.26 | 172.54 | 108.28 | 172.67 | 108.28 | 172.55 | 108.27 | 172.64 | 108.2 | 172.35 | 107.48 | 140.71 | 107.88 | 172.51 | 107.97 |

FIG. 7

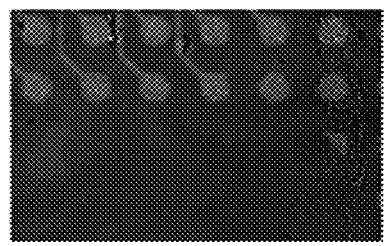
FIG. 18A
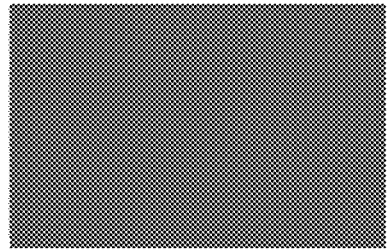 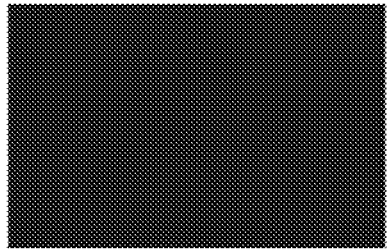
FIG. 18B            FIG. 18C

INFRARED REFLECTION/ABSORPTION LAYER FOR REDUCING GHOST IMAGE OF INFRARED REFLECTION NOISE AND IMAGE SENSOR USING THE SAME

RELATED APPLICATIONS

The present application is a divisional of U.S. patent application Ser. No. 13/662,640 filed Oct. 29, 2012, which is incorporated herein by reference.

BACKGROUND

1. Technical Field

This disclosure is related to image sensors and, in particular, to image sensors in which ghost images caused by reflection of infrared (IR) radiation are substantially reduced or eliminated.

2. Discussion of Related Art

Image sensors with both visible and near infrared (NIR) capability have been used in automotive sensors in such applications as driver assistance applications and safety applications, such as pedestrian, obstruction and sign detection, rearview or back-up camera applications, etc. Such sensors can operate in a dual mode, which allows them to function both in daylight (in the visible light spectrum application) and night vision (in the IR application). This newly incorporated IR capability is made possible by the development and implementation of a number of process-level enhancements that expand the senors' spectral light sensitivity to about 1050 nm, which is well into the NIR range of 750-1400 nm.

One drawback of this dual-mode capability is that the new sensitivity in the NIR range has resulted in IR ghost images being created. In certain situations, IR radiation can be reflected, such as, for example, by a redistribution layer (RDL) of the image sensor, and then detected by the image sensor. This introduces noise into the image sensor and, therefore, reduces the sensitivity of the image sensor.

SUMMARY

According to a first aspect, an image sensor is provided. The image sensor includes a photosensing element for receiving infrared (IR) radiation and detecting the IR radiation and generating an electrical signal indicative of the IR radiation. A redistribution layer (RDL) is disposed under the photosensing element, the RDL comprising a pattern of conductors for receiving the electrical signal. An IR reflection layer is disposed between the photosensing element and the RDL, said IR reflection layer reflecting a reflected portion of the IR radiation back to the photosensing element such that the reflected portion of the IR radiation does not impinge upon the RDL.

According to another aspect, an image sensor is provided. The image sensor includes a photosensing element for receiving infrared (IR) radiation and detecting the IR radiation and generating an electrical signal indicative of the IR radiation. A redistribution layer (RDL) is disposed under the photosensing element, the RDL comprising a pattern of conductors for receiving the electrical signal. An IR absorption layer is disposed between the photosensing element and the RDL, IR absorption layer absorbing the IR radiation such that a substantial portion of the IR radiation does not impinge upon the RDL.

According to another aspect, an image sensor is provided. The image sensor includes a photosensing element for receiving infrared (IR) radiation and detecting the IR radiation and generating an electrical signal indicative of the IR radiation. A redistribution layer (RDL) is disposed under the photosensing element, the RDL comprising a pattern of conductors for receiving the electrical signal. An isolation layer is disposed between the photosensing element and the RDL, the isolation layer being adapted to absorb the IR radiation such that a substantial portion of the IR radiation does not impinge upon the RDL.

According to another aspect, an image sensor is provided. The image sensor includes a photosensing element for receiving infrared (IR) radiation and detecting the IR radiation and generating an electrical signal indicative of the IR radiation. A redistribution layer (RDL) is disposed under the photosensing element, the RDL comprising a pattern of conductors for receiving the electrical signal. An IR barrier layer is disposed between the photosensing element and the RDL, said IR barrier layer preventing the IR radiation from impinging upon the RDL.

BRIEF DESCRIPTION OF THE DRAWINGS

The foregoing and other features and advantages will be apparent from the more particular description of preferred embodiments, as illustrated in the accompanying drawings, in which like reference characters refer to the same parts throughout the different views. The drawings are not necessarily to scale, emphasis instead being placed upon illustrating the principles of the preferred embodiments. In the drawings, the sizes and thicknesses of layers, regions and features may be exaggerated for clarity.

FIG. 7 contains a table which provides examples related to the exemplary embodiments described herein in which multiple transparent sub-layers of dielectric materials achieve constructive reflection.

FIGS. 18A-18C are images which illustrate the results of the approaches of the exemplary embodiments used in reducing or eliminating ghost imaging, specifically, ghost imaging of the RDL of an image sensor. Specifically, FIG. 18A is an image produced without any IR barrier layer. FIG. 18B is an image illustrating the effects of adding an IR reflection barrier layer between the RDL and the sensing layer, according to some exemplary embodiments. FIG. 18C is an image illustrating the effects of adding an IR absorption barrier layer between the RDL and the sensing layer, according to some exemplary embodiments.

DETAILED DESCRIPTION

Figure 1:
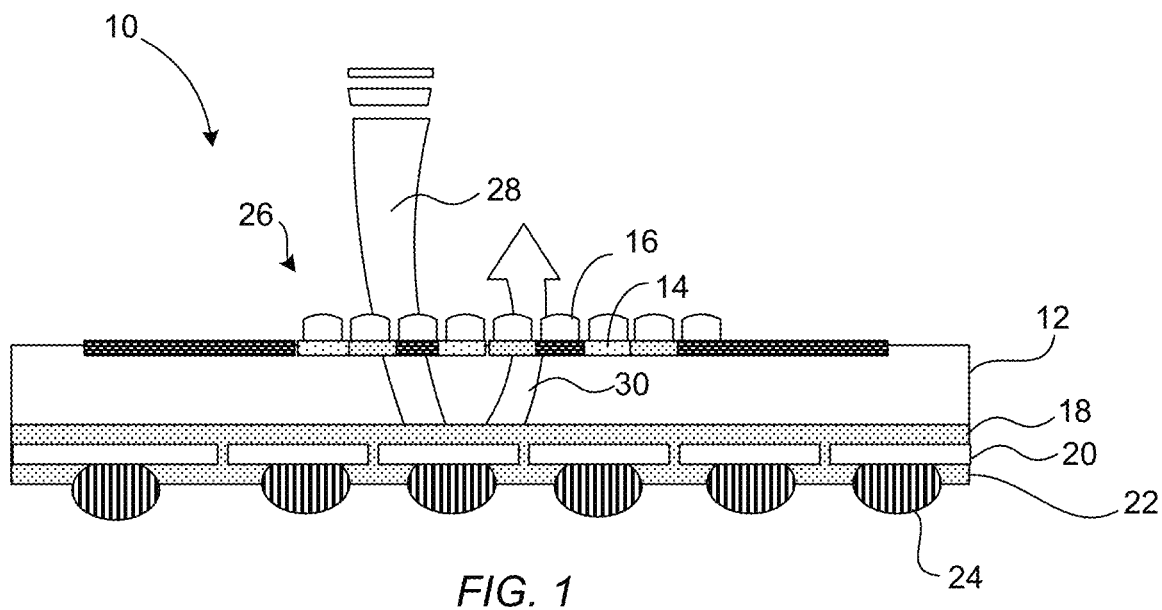
FIG. 1 includes a schematic cross-sectional illustration of an image sensor, illustrating reflection of IR radiation, which can result in generation of an undesirable ghost image.

Referring to FIG. 1, an image sensor 10 can be formed of multiple layers, which can include a photosensitive sensing layer 12, which can include photodetectors and which detects both visible and IR light and generates electrical signals indicative of attributes, e.g., intensity, of the detected light, and outputs the electrical signals. Light enters the sensing layer 12 through a window 26, which is defined by a layer of pixel lenses 16 and a layer of color filters 14, which are formed on the sensing layer 12. Color filters 14 may include RGB (red, green and blue) filters arranged in various patters, such as the Bayer Patter as known in the art. They may additionally include panchromatic filters, i.e., clear filters.

An isolation layer 18 is formed beneath sensing layer 12. A redistribution layer (RDL) 20, which includes a pattern of conductive traces for conducting electrical signals, e.g., the electrical signals generated by sensing layer 12, as required, is formed under isolation layer 18. An isolating protective passivation layer 22 can be formed beneath and within RDL 20 to protect the conductive layer traces from the external environment, such that undesirable open or short circuits in RDL 20, which could be caused by exposure to the external environment and which could render image sensor 10 inoperable, are prevented. A pattern of conductive input/output (I/O) pads 24, illustrated in FIG. 1 in the form of conductive solder bumps, is formed within passivation layer 22 in electrical contact with RDL 20 as appropriate to make electrical contact between the external environment and the pattern of conductive traces in RDL 20. RDL 20 is a patterned metal layer of wiring which enables electrical bonding from various locations internal to image sensor 10 out to external I/O pads 24. RDL 20 is important to the electrical linking of internal components of image sensor 10 to external components.

As illustrated in FIG. 1, light 28, which includes IR light, and, specifically, NIR light, enters sensing layer 12 of image sensor 10 through lenses 16 and filters 14 in window 26, where it is sensed by the photodetectors in sensing layer 12. Because IR light has relatively long wavelengths, it may travel deeper through sensing layer 12. As a result, the IR light may reach RDL 20 and be reflected back into sensing layer 12, as illustrated in FIG. 1 by reflected portion 30 of IR light 28. Reflected portion 30 of IR light 28 is then detected by sensing layer 12, which then produces a ghost image of RDL 20. Additionally, IR light may also enter image sensor 10 through the back side, can penetrate passivation layer 22, RDL 20 and isolation layer 18 into sensing layer 12, and, therefore, can contribute further to generation of a ghost image.

Figure 2A:
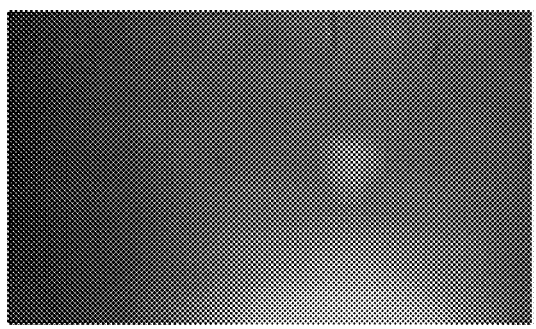
FIG. 2A includes a clear image, i.e., a control image, in which no ghost image has been formed.
Figure 2B:
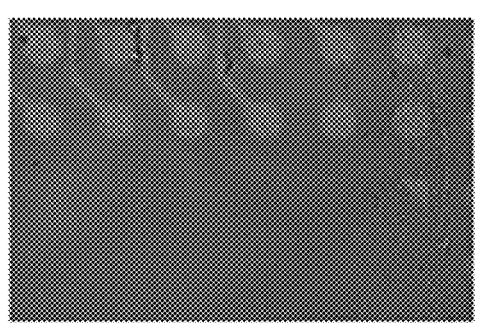
FIG. 2B includes an image in which a ghost image is formed.

FIGS. 2A and 2B include images illustrating the ghost image that can be formed as described above in connection with FIG. 1. FIG. 2A includes a clear image, i.e., a control image, in which no ghost image has been formed. FIG. 2B includes an image in which a ghost image is formed. As clearly seen in FIG. 2B, an image of RDL 20, showing its conductive traces and pads, is generated within the clear image of the region being viewed. That is, reflected portion 30 of IR light 28 carries the information regarding the shape of RDL 20 and adds that information to the information used in generating the image of FIG. 2B. As noted above, this result is highly undesirable since it lowers the sensitivity of image sensor 10 and degrades the quality of images generated by image sensor 10. It is noted that the images in FIGS. 2A and 2B were generated by an image sensor 10 operating at a wavelength range of $\lambda$=900~1200 nm, as an exemplary illustration. It is noted that other wavelength ranges are possible and are within the scope of the present disclosure.

Figure 3:
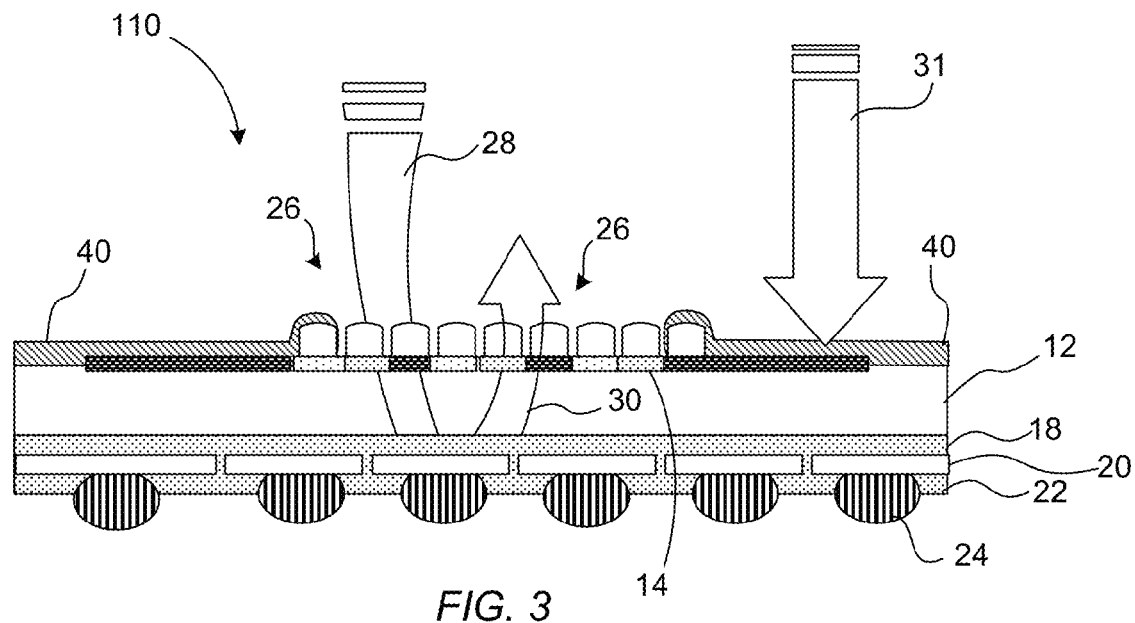
FIG. 3 includes a schematic cross-sectional illustration of an image sensor which can generate a ghost image of the RDL of the image sensor.
Figure 4:
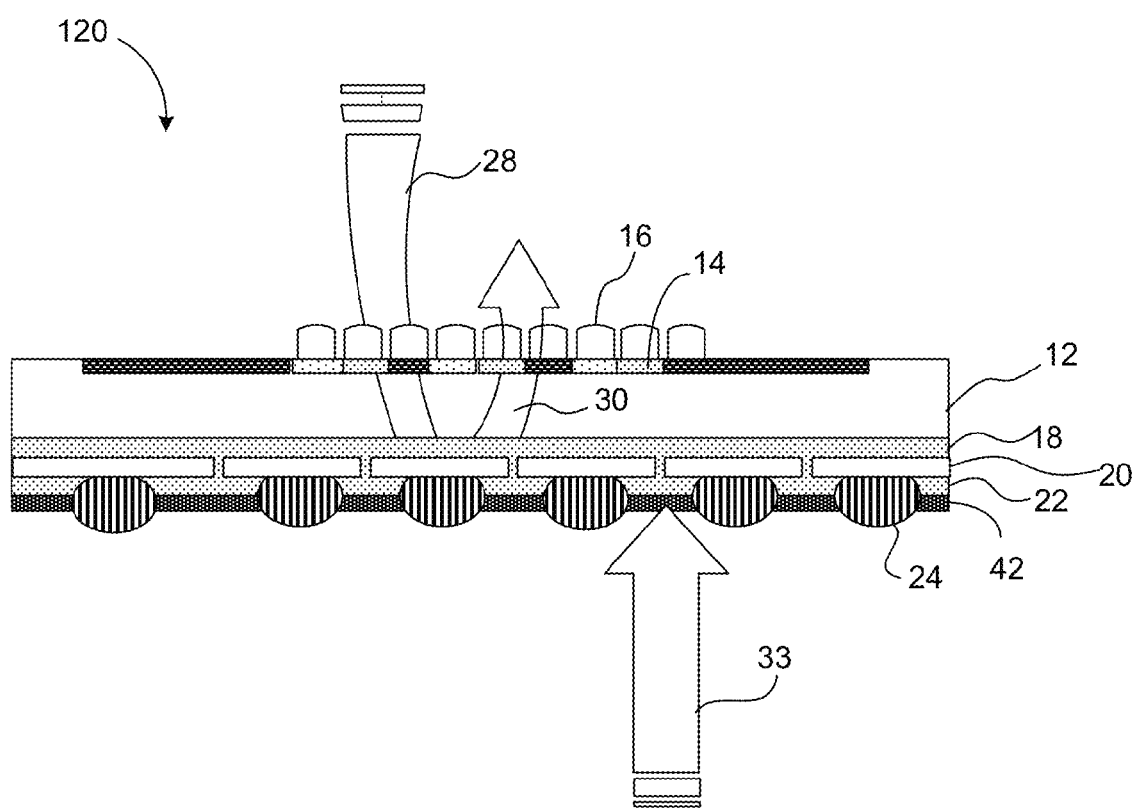
FIG. 4 includes a schematic cross-sectional illustration of another image sensor which can generate a ghost image of the RDL of the image sensor.

Possible approaches to reducing the ghost image are illustrated in FIGS. 3 and 4, which are schematic cross-sectional illustrations of image sensors 110 and 120, respectively. Various elements of image sensors 110 and 120 are the same as corresponding elements of image sensor 10 described above in detail in connection with FIG. 1. These like elements are identified by like reference numerals. Detailed description of these like elements will not be repeated.

Referring to FIG. 3, image sensors 110 and 120 include a layer or coating of black photoresist (BPR) 40 and 42, respectively, applied to their top side and/or bottom side, respectively. Specifically, image sensor 110 of FIG. 3 includes a layer 40 of BPR applied to its top side, and image sensor 120 of FIG. 4 includes a layer 42 of BPR applied to its bottom side. The layers 40 and 42 of BPR are opaque to IR radiation and, therefore, any IR radiation impinging on the BPR does not penetrate. However, referring to FIG. 3, even though the BPR 40 is applied to the top side of image sensor 110 and stops IR light 31 from penetrating down to reach RDL 20, the window 26 which exposes the active area of the device must remain unblocked to allow the radiation/light 28 to penetrate to sensing layer 12 to be detected. As a result, IR light cannot be completely prevented from reflecting from the RDL 20 to produce the reflected portion 30 of the radiation/light, which results in generation of the ghost image.

Referring to FIG. 4, BPR layer 42 is formed on the back or bottom side of image sensor 120. It should be noted that it is desirable that the BPR 42 not cover the solder balls or pads 24 on the back side of the device, such that electrical connection to the device is not hindered by BPR 42. As illustrated in FIG. 4, the same situation regarding the reflected portion 30 of radiation/light exists, that is, portion 30 is reflected from RDL 20 back into sensing layer 12, such that the ghost image is generated. However, BPR layer 42 on the back side of image sensor 120 prevents IR light 33 from penetrating into the device. As a result, IR light 33 does not contribute to the ghost image.

Figure 5:
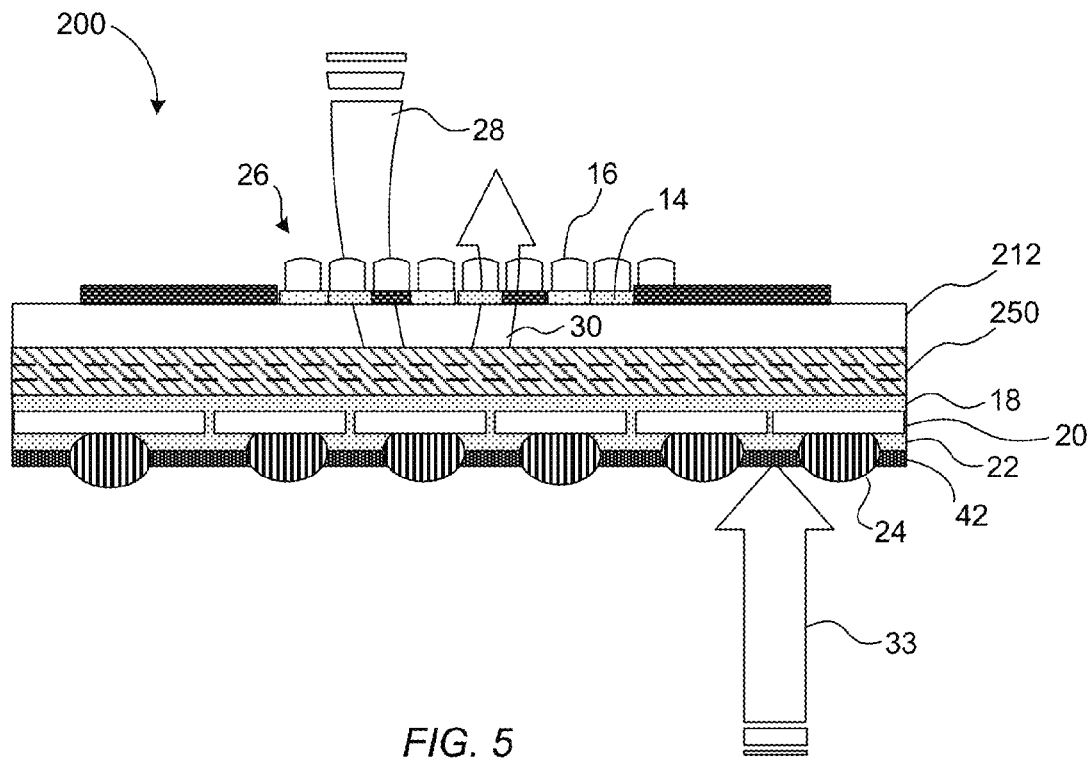
FIG. 5 includes a schematic cross-sectional diagram of an image sensor including an IR reflection layer, according to some exemplary embodiments.
Figure 6:
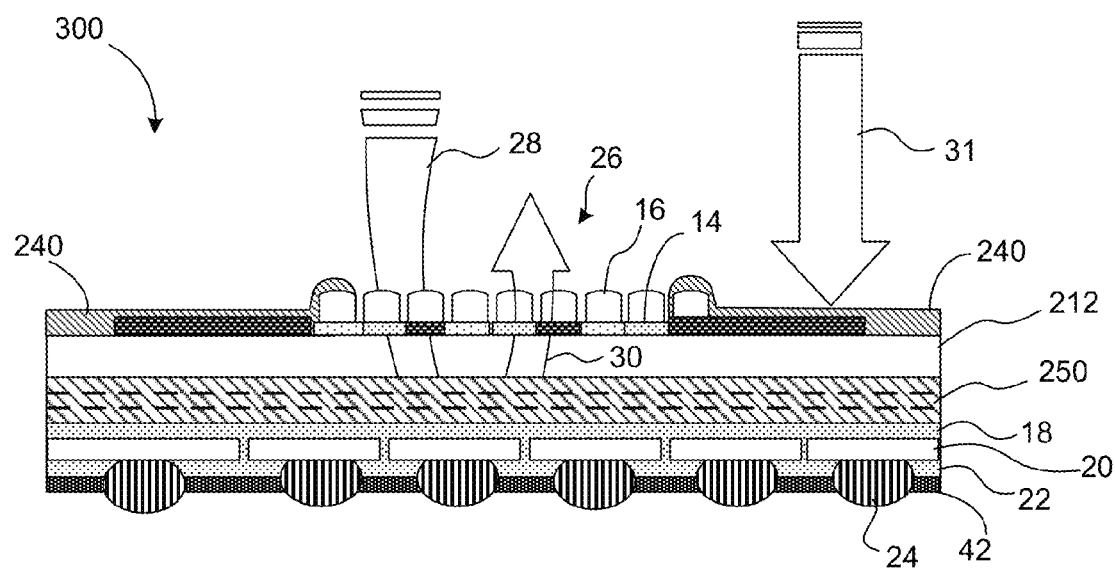
FIG. 6 includes a schematic cross-sectional diagram of another image sensor including an IR reflection layer, according to some exemplary embodiments.

According to exemplary embodiments, to prevent ghost images caused by reflection of IR light from the RDL, an IR barrier layer is disposed between the sensing layer and the RDL. According to some exemplary embodiments, the IR barrier layer is an IR reflection layer, and in some exemplary embodiments, the IR barrier layer is an IR absorption layer. FIGS. 5 and 6 include schematic cross-sectional diagrams of image sensor devices 200 and 300, respectively, including IR reflection layers, according to some exemplary embodiments. Referring to FIGS. 5 and 6, various elements of image sensors 200 and 300 are the same as corresponding elements of image sensors 10, 110, and 120 described above in detail in connection with FIGS. 1, 3 and 4, respectively. These like elements are identified by like reference numerals. Detailed description of these like elements will not be repeated.

Referring to FIG. 5, an image sensor 200 includes an additional IR reflection layer 250 over isolation layer 18. IR reflection layer 250 reflects IR light 28 which penetrates through sensing layer 212 to generate a reflected portion 230 of IR light. Reflected portion 230 of the IR light passes back through sensing layer 212 where it is detected and, as a result, contributes to the image generated by image sensor 200. However, because the IR light 28 is reflected back by IR reflection layer 250 before it reaches RDL 20, a ghost image of RDL 20 including conductive traces, pads, etc., as illustrated in FIG. 2B, is not generated and, therefore, does not affect the image generated by image sensor 200. That is, even though reflected portion 230 of the IR light is added to the image generated by image sensor 200 and, therefore, does introduce some noise in the form of additional IR light detection, a ghost image of RDL 20 is not formed and does not become part of the final image generated by image sensor 200.

As shown in FIG. 5, image sensor 200 can also include BPR layer or film 42 applied to its back surface. BPR layer or film 42 blocks, i.e., absorbs, IR light 33 incident on the back side of image sensor 200, thus preventing IR light 33 from introducing noise and, therefore, degrading the image generated by image sensor 200.

Referring to FIG. 6, another image sensor 300 according to exemplary embodiments is illustrated. Image sensor 300 is the same as image sensor 200 described above in connection with FIG. 5, with the exception that image sensor 300 includes a BPR layer or film 240 applied to the front or top side of image sensor 300, instead of the back or bottom side. In this embodiment, IR light 31 incident on the top or front surface of image sensor 300 in the non-active region of the device is blocked, i.e., absorbed, such that it does not enter sensing layer 212 and, therefore, does not introduce noise or degrade the image generated by image sensor 300.

In image sensor 300 of FIG. 6, BPR layer or film 240 must remain open at window 26 such that IR light 28 can enter sensing layer 212 and be detected. Some of the IR light 28 completely penetrates sensing layer 212 and is reflected back into sensing layer 212 by IR reflection layer 250, such that it is detected by sensing layer 212 and is, therefore, included in the image generated by image sensor 300, thus introducing some noise and image degradation. However, once again, because the IR light 28 does not reach RDL 20, no ghost image of RDL 20 is formed, and, therefore, substantial noise and image degradation is eliminated.

It will be noted that the embodiments of image sensors 200 and 300 illustrated in FIGS. 5 and 6 include BPR layers or films formed on their back/bottom and front/top sides, respectively. It will be understood that, within the scope of this disclosure, either of image sensors 200 and 300 can include a BPR layer or film on either its back/bottom side, its front/top side, both its back/bottom side and its front/top side, or neither its back/bottom nor its front/top side.

According to exemplary embodiments, IR reflection layer 250 can be a single layer or can be formed of multiple layers or sub-layers. These various configurations of IR reflection layer 250 are described below in detail. In FIGS. 5 and 6, IR reflection layer 250 is illustrated by including dashed horizontal lines to illustrate the optional multi-sub-layer configurations. It will be understood that three layers are illustrated by the dashed lines for the sake of providing a clear and complete description and are exemplary only. Any number of sub-layers can be used within the scope of this disclosure.

As noted above, according to exemplary embodiments, IR reflection layer 250 can take on any of several possible configurations. For example, in some exemplary embodiments, reflection layer 250 uses constructive reflection to achieve almost total reflection using multiple transparent sub-layers. In some exemplary embodiments, a single layer of reflective metal is used for reflection layer 250. The single reflective metal layer does not generally achieve as high a level of reflection as the configuration having multiple transparent sub-layers; however, the single reflective metal layer is generally thinner than the multiple transparent sub-layers.

In the embodiments having multiple transparent sub-layers of dielectric materials, constructive reflection refers to using multiple layers to achieve a high degree of reflection. There are generally two factors that contribute to an increased level of reflection.

First, at a simple interface between two dielectric materials, the amplitude of reflected light is a function of the ratio of the refractive indices of the two materials, the polarization of the incident light, and the angle of incidence. For example, at normal incidence, i.e., incident light is perpendicular to the interface, the relative amplitude of the reflected light, as a proportion of the incident light, is given by $(1-p)/(1+p)$, where $p=n_1/n_2$, and intensity is the square of this expression, i.e., $((n_2-n_1)/(n_2+n_1))^2$, wherein $n_1$ and $n_2$ are the refractive indices of the first and second dielectric materials, respectively. Thus, the greater the difference between refractive indices of the materials, the greater the reflection. For example, for an air/glass interface, $n_1=1$ (air), and $n_2=1.5$ (glass), so the intensity of the reflected light is 4% of the incident light. Multiple sub-layers of dielectric material will introduce multiple interfaces. As a result, the amount of reflection will increase with additional layers.

Second, the thicknesses of the layers may be chosen so as to reinforce reflected light through constructive interference. This is accomplished through use of a type of interference coating that strengthens reflection. Reflection interference is the opposite of the more commonly known anti-reflection interference, where the thicknesses of the layers are chosen so that the reflected light will destructively interfere and cancel each other since they are exactly out of phase. In reflection interference, the thicknesses of the layers are chosen so that the reflected light will constructively interfere and reinforce each other since they are in phase.

FIG. 7 contains a table which provides examples related to the exemplary embodiments described above in which multiple transparent sub-layers of dielectric materials achieve constructive reflection. Referring to the table of FIG. 7, two sets of parameters are manipulated to maximize IR reflection. For the first factor of utilizing multiple interfaces of dielectric materials with proper refractive indices, $SiO_2$ (n=1.455) and $TiO_2$ (n=2.37) are arranged in an alternating fashion to form an IR reflection layer with 19 sub-layers. For the second factor of choosing specific thicknesses to reinforce reflection interference, thicknesses of each layer in nanometers (nm) are included in the table of FIG. 7. Referring to the specific exemplary embodiment defined in the table of FIG. 7, as a result of the selections of materials and the quantity and thicknesses of layers, for IR light with a wavelength between 900 and 1200 nm, a total reflection of 98% is achieved with this multi-layered structure. It will be understood that different reflections can be realized by selections of different materials and quantities and thicknesses of layers.

Figure 8:
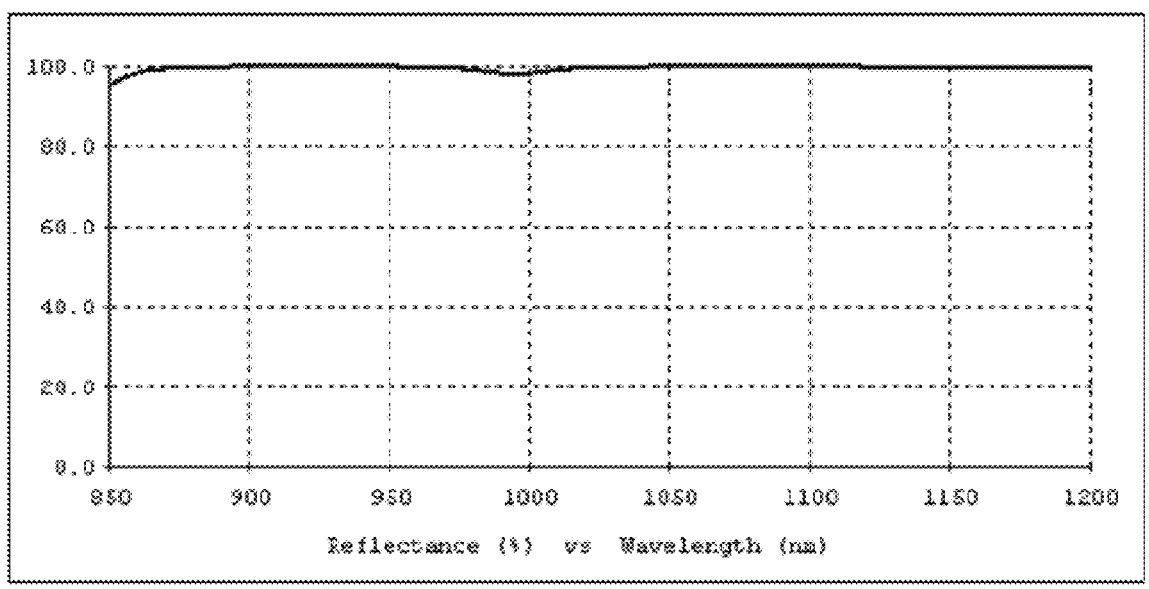
FIG. 8 includes a graph which illustrates a profile of reflection percentage as a function of wavelength for the multi-layer dielectric materials structure defined in the table of FIG. 7.

FIG. 8 includes a graph which illustrates a profile of reflection percentage as a function of wavelength for the multi-layer dielectric materials structure defined in the table of FIG. 7. As shown in the graph of FIG. 8, the reflection achieved is almost 100% throughout the entire 900-1200 nm spectral range.

As noted above, in other exemplary embodiments, a single layer of reflective metal is used for the IR reflection layer. When a single layer of metal material is used, the IR reflection layer may be made considerably thinner than the multi-layer dielectric materials structure. However, the reflection performance is not as good as that of the multi-layer dielectric materials approach. Furthermore, increasing the thickness of the metal layer will not increase reflection beyond a certain point.

Figure 9:
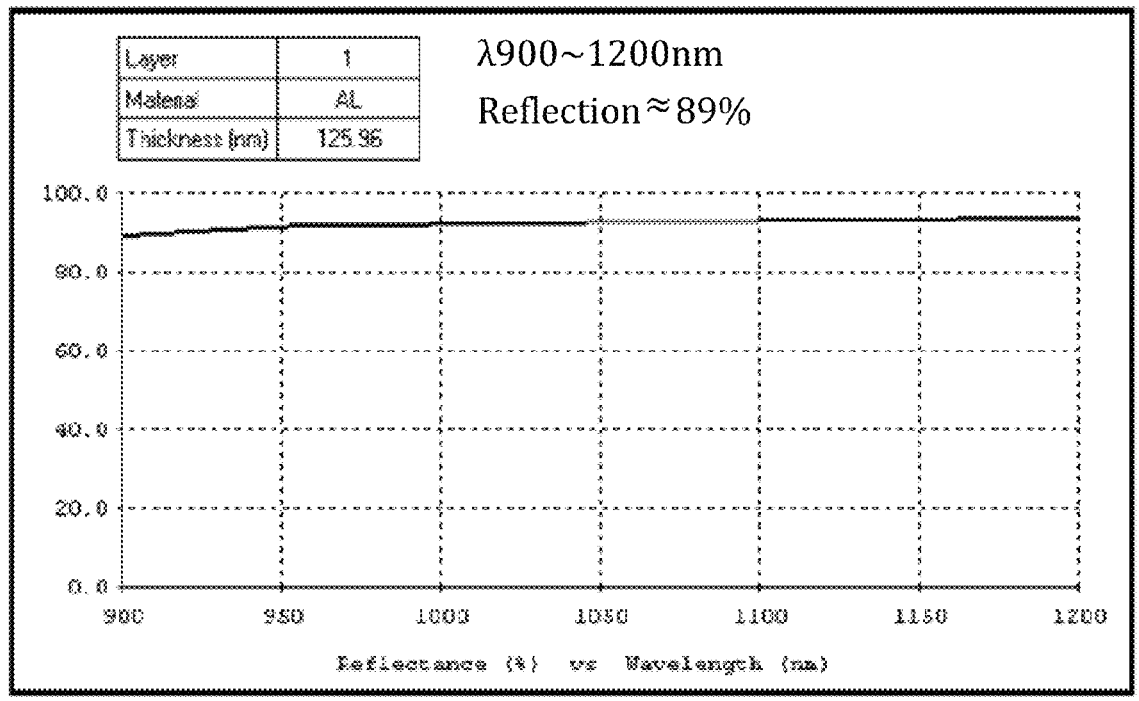
FIG. 9 includes a graph which illustrates a profile of reflection percentage as a function of wavelength for a single layer of aluminum having a thickness of 125.96 nm.

In some particular exemplary embodiments, when a single layer of, for example, aluminum, is used, reflection of IR (wavelength in the range of 900-1200 nm) will be capped at 89% when the thickness of the layer is 126 nm. A thickness of more than 126 nm will not increase reflection further. If the thickness of the layer is less than 126 nm, reflection will decrease. FIG. 9 includes a graph which illustrates a profile of reflection percentage as a function of wavelength for a single layer of aluminum having a thickness of 125.96 nm. Referring to FIG. 9, it is readily observed that the reflection performance is not as good as that of the multi-layered dielectric materials structure, although the aluminum IR reflection layer is considerably thinner.

Figure 10:
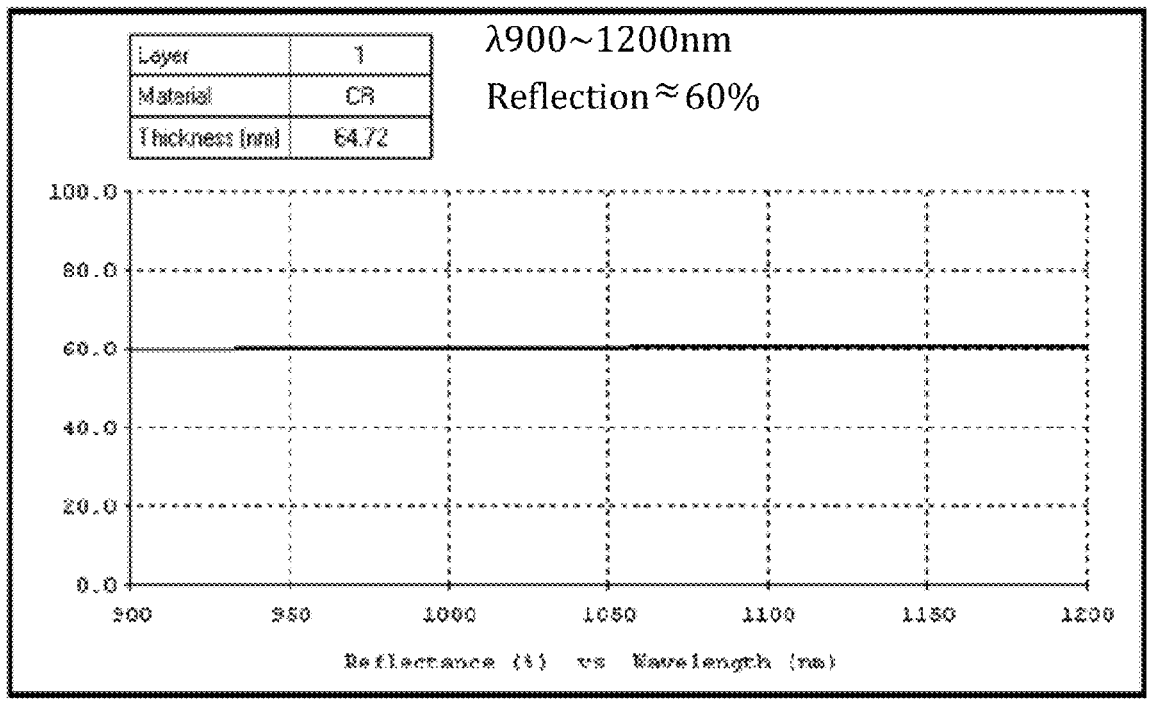
FIG. 10 includes a graph which illustrates a profile of reflection percentage as a function of wavelength for a single layer of chromium having a thickness of 64.72 nm.

As another example, when a single layer of chromium is used, IR reflection will be capped at 60% at a thickness of 65 nm. Thickness of more than 65 nm will not increase reflection. If the thickness is less than 65 nm, the reflection will decrease. FIG. 10 includes a graph which illustrates a profile of reflection percentage as a function of wavelength for a single layer of chromium having a thickness of 64.72 nm. Referring to FIG. 10, it is readily apparent that reflection performance is not as good as the multi-layered dielectric materials structure or the single layer of aluminum, although the chromium IR reflection layer is the thinnest of these three examples.

Other metals besides aluminum and chromium can be used in the single-metal-layer configuration. For example, other metals that can be used include, but are not limited to gold, silver, copper, etc.

In accordance with exemplary embodiments, a thinner IR reflection layer is generally desirable because it results in a thinner image sensor. This results in a trade-off between achieving a high level of IR reflection and the extent to which the thickness of the image sensor can be reduced.

As described above, according to exemplary embodiments, to prevent ghost images caused by reflection of IR light from the RDL, an IR barrier is disposed between the sensing layer and the RDL. According to some exemplary embodiments described above, the IR barrier layer is an IR reflection layer. In some exemplary embodiments, the IR barrier layer is an IR absorption layer.

Figure 11:
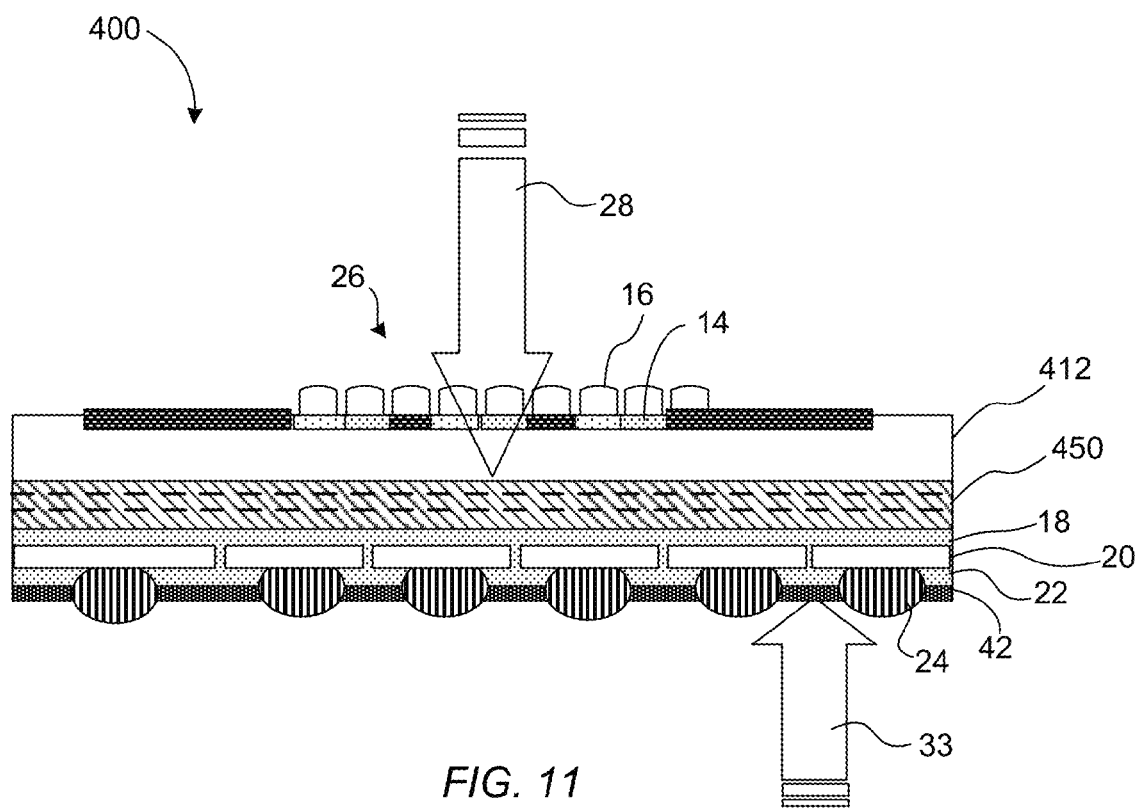
FIG. 11 includes a schematic cross-sectional diagram of an image sensor device, including an IR absorption layers, according to some exemplary embodiments.
Figure 12:
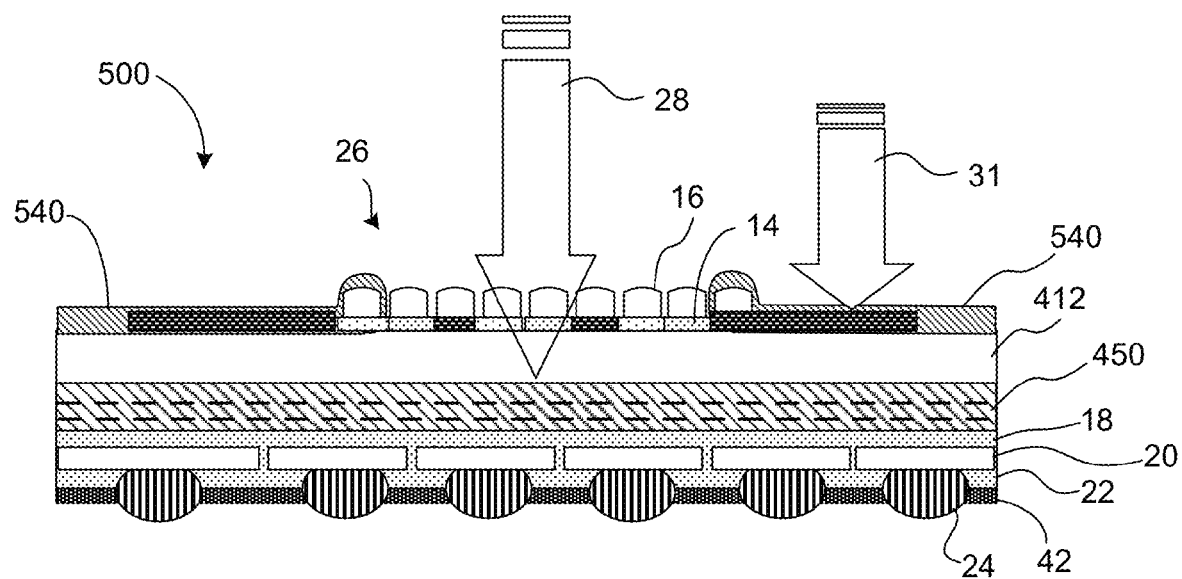
FIG. 12 includes a schematic cross-sectional diagram of another image sensor device, including an IR absorption layers, according to some exemplary embodiments.

FIGS. 11 and 12 include schematic cross-sectional diagrams of image sensor devices 400 and 500, respectively, including IR absorption layers, according to some exemplary embodiments. Referring to FIGS. 11 and 12, various elements of image sensors 400 and 500 are the same as corresponding elements of image sensors 10, 110, 120, 200 and 300 described above in detail in connection with FIGS. 1, 3, 4, 5 and 6, respectively. These like elements are identified by like reference numerals. Detailed description of these like elements will not be repeated.

Referring to FIG. 11, an image sensor 400 includes an additional IR absorption layer 450 over isolation layer 18. IR absorption layer 450 absorbs IR light 28 which penetrates through sensing layer 412, such that no IR light passes back through sensing layer 412. As a result, no ghost image is produced.

As shown in FIG. 11, image sensor 400 can also include BPR layer or film 42 applied to its back surface. BPR layer or film 42 blocks, i.e., absorbs, IR light 33 incident on the back side of image sensor 400, thus preventing IR light 33 from introducing noise and, therefore, degrading the image generated by image sensor 400.

Referring to FIG. 12, another image sensor 500 according to exemplary embodiments is illustrated. Image sensor 500 is the same as image sensor 400 described above in connection with FIG. 11, with the exception that image sensor 500 includes a BPR layer or film 540 applied to the front or top side of image sensor 500, instead of the back or bottom side. In this embodiment, IR light 31 incident on the top or front surface of image sensor 500 in the non-active region of the device is blocked, i.e., absorbed, such that it does not enter sensing layer 412 and, therefore, does not introduce noise or degrade the image generated by image sensor 500. In image sensor 500 of FIG. 12, BPR layer or film 540 must remain open at window 26 such that IR light 28 can enter sensing layer 412 and be detected. However, IR absorption layer 450 absorbs IR light 28 which penetrates through sensing layer 412, such that no IR light passes back through sensing layer 412. As a result, no ghost image is produced.

It will be noted that the embodiments of image sensors 400 and 500 illustrated in FIGS. 11 and 12 include BPR layers or films formed on their back/bottom and front/top sides, respectively. It will be understood that, within the scope of this disclosure, either of image sensors 400 and 500 can include a BPR layer or film on either its back/bottom side, its front/top side, both its back/bottom side and its front/top side, or neither its back/bottom nor its front/top side.

According to exemplary embodiments, IR absorption layer 450 can be a single layer or can be formed of multiple layers or sub-layers. These various configurations of IR absorption layer 450 are described below in detail. In FIGS. 11 and 12, IR absorption layer 450 is illustrated by including dashed horizontal lines to illustrate the optional multi-sub-layer configurations. It will be understood that three layers are illustrated by the dashed lines for the sake of providing a clear and complete description and are exemplary only. Any number of sub-layers can be used within the scope of this disclosure.

As noted above, according to exemplary embodiments, IR absorption layer 450 can take on any of several possible configurations. For example, in some exemplary embodiments, the absorption layer uses resonance to achieve almost total absorption using a metal-dielectric-metal sandwich structure. In other exemplary embodiments, the absorption layer uses a single layer of metal. In these embodiments, the resulting percent of absorption is not as good as that of the metal-dielectric-metal sandwich embodiments, although the single metal absorption layer is thinner.

As noted above, in some exemplary embodiments, the IR absorption layer includes a composite metal-dielectric-metal sandwich type structure. The metal sub-layer facing the incident IR light can be substantially thicker than the other metal layer. IR light that reaches this composite structure resonates back and forth between the two metal layers, resulting in most of its energy being absorbed. Two sets of parameters are selected. The first set of parameters includes the types of metal and dielectric material. The second set of parameters is the thickness of each sub-layer. When proper parameters are chosen, the IR light will form a standing wave between the two metal layers, resulting in significant resonance and energy absorption.

Figure 13:
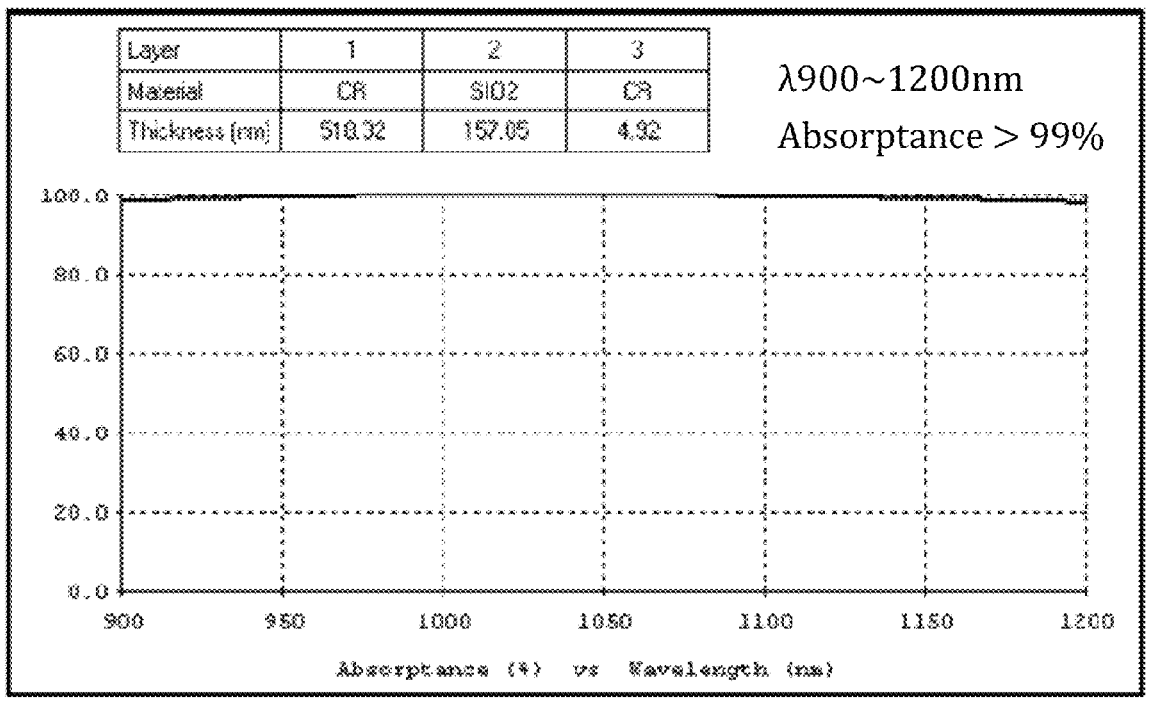
FIG. 13 includes a graph which illustrates absorption (%) vs. wavelength for a metal-dielectric-metal sandwich absorption layer having a chromium-$SiO_2$-chromium sandwich structure, according to some exemplary embodiments.
Figure 14:
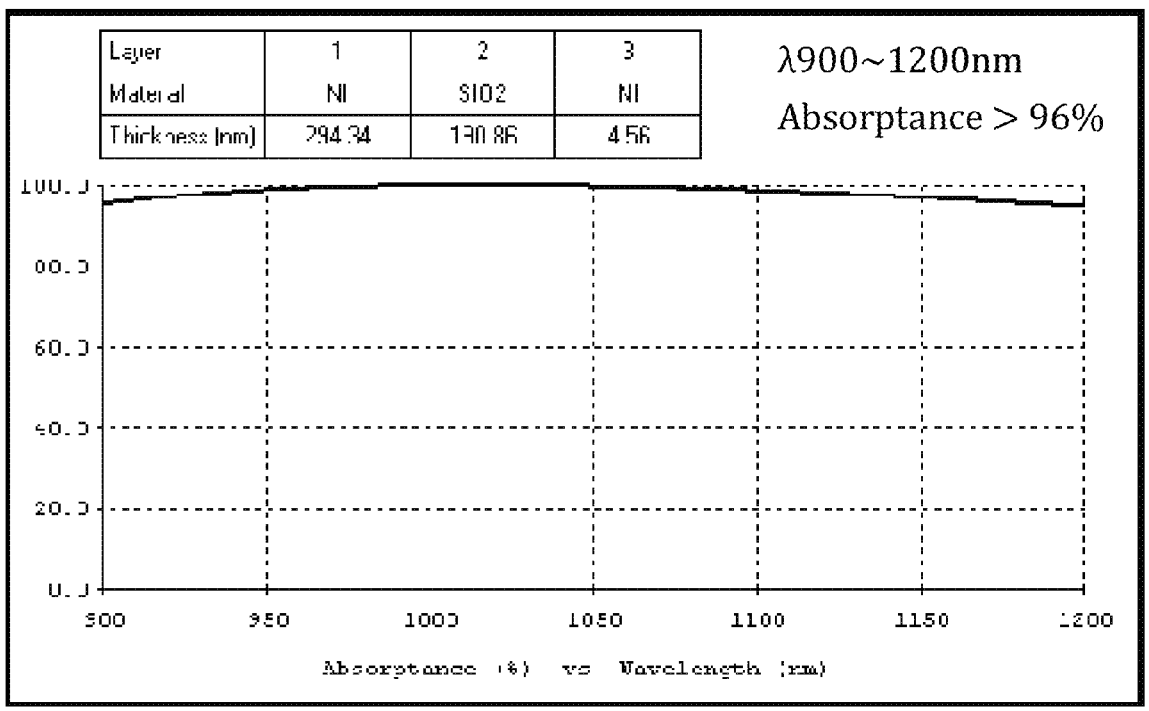
FIG. 14 includes a graph which illustrates absorption (%) vs. wavelength for a metal-dielectric-metal sandwich absorption layer having a nickel-$SiO_2$-nickel sandwich structure, according to some exemplary embodiments.

FIG. 13 contains a graph which illustrates absorption (%) vs. wavelength for a metal-dielectric-metal sandwich absorption layer having a chromium-$SiO_2$-chromium sandwich structure, according to some exemplary embodiments. FIG. 14 contains a graph which illustrates absorption (%) vs. wavelength for a metal-dielectric-metal sandwich absorption layer having a nickel-$SiO_2$-nickel sandwich structure, according to some exemplary embodiments.

Referring to FIG. 13, the thickness of each sub-layer is shown in the drawing. As illustrated in the drawing, this absorption layer structure may absorb more than 99% of IR light throughout the 900-1200 nm spectral range. Referring to FIG. 14, the thickness of each sub-layer is shown in the drawing. As illustrated in the drawing, this absorption layer structure may absorb more than 96% of IR light throughout the 900-1200 nm spectral range.

As noted above, in some exemplary embodiments, the IR absorption layer includes a single layer of metal. In these embodiments, the IR absorption layer can be made considerably thinner. However, the IR absorption performance is not as good as the sandwich composite structure approach described in detail above. Also, increasing the thickness of the metal layer will not increase IR absorption beyond a certain point.

In some particular exemplary embodiments, when a single layer of, for example, chromium, is used, absorption of IR (wavelength in the range of 900-1200 nm) will be capped at 40% when the thickness of the layer is 17 nm. A thickness of more than 17 nm will not increase absorption further. In some particular exemplary embodiments, when a single layer of, for example, nickel, is used, absorption of IR (wavelength in the range of 900-1200 nm) will be capped at 36.5-37.5% when the thickness of the layer is 12 nm. A thickness of more than 12 nm will not increase absorption further.

Figure 15:
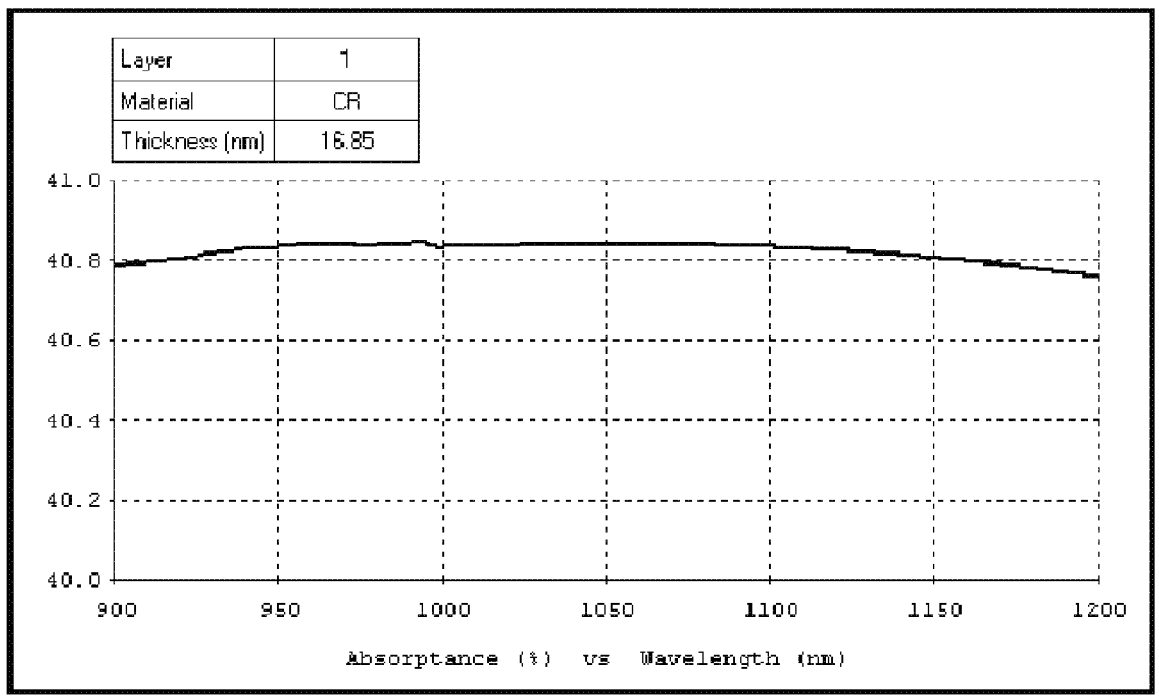
FIG. 15 includes a graph which illustrates a profile of absorption percentage as a function of wavelength for a single layer of chromium having a thickness of 16.85 nm.
Figure 16:
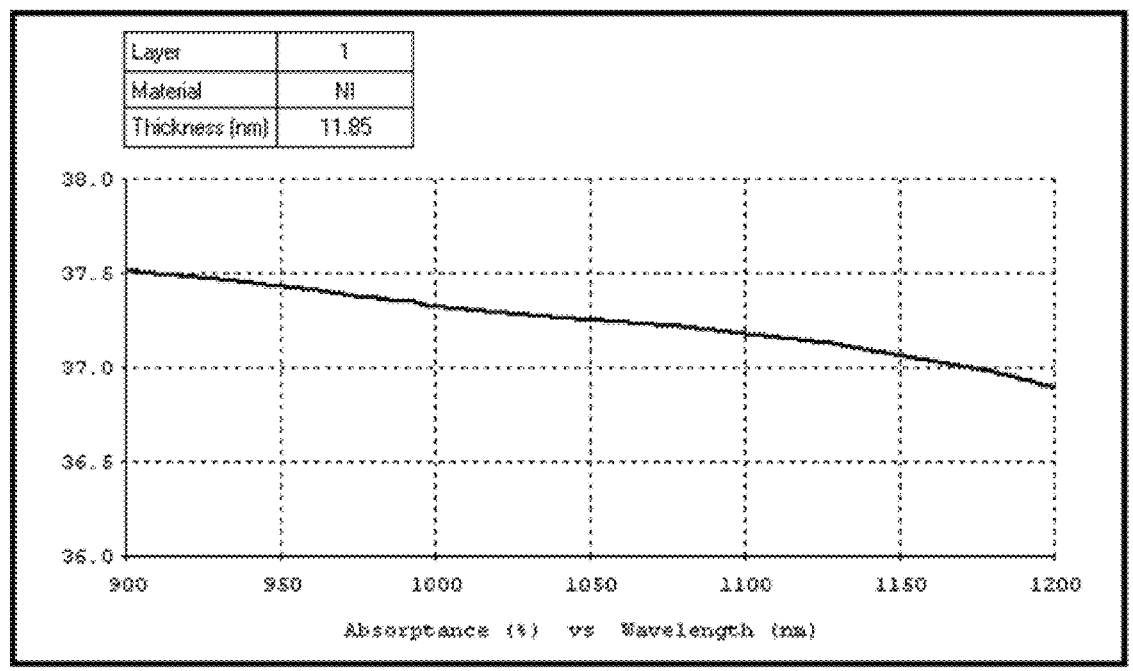
FIG. 16 includes a graph which illustrates a profile of absorption percentage as a function of wavelength for a single layer of nickel having a thickness of 11.85 nm.

FIG. 15 includes a graph which illustrates a profile of absorption percentage as a function of wavelength for a single layer of chromium having a thickness of 16.85 nm. FIG. 16 includes a graph which illustrates a profile of absorption percentage as a function of wavelength for a single layer of nickel having a thickness of 11.85 nm. Referring to FIGS. 15 and 16, it is apparent that the absorption profile of chromium is more even throughout the spectral range than that of nickel. Also, it is readily observed that the absorption performances are not as good as that of the sandwich composite structures, although the metal layers are considerably thinner.

In accordance with exemplary embodiments, in addition to the sandwich composite structures and the single-metal-layer structures, the IR absorption layer can also be formed to have other structures. For example, in some exemplary embodiments, some sandwich type composite IR absorption layers do not use metal-dielectric-metal arrangements. Examples of these include $SiO_2$—$Cr_2O_3$—$SiO_2$, $SiO_2$—TaN—$SiO_2$, Cr—$CrO_x$—$CrO_xN_y$, etc. Also, according to some exemplary embodiments, there are two-sub-layer type composite IR absorption layers, instead of the three-sub-layer type composite IR absorption layers described above. Examples of these two-sub-layer type composite IR absorption layers include $Si_3N_4$—TaN, SiC—$SiO_2$, etc. Also, according to some exemplary embodiments, some single-layer non-composite IR absorption layers do not use metals. Examples of these include $Cr_2O_3$, CrSiO, $Ni_xO_y$, carbon black, black inorganic materials, etc.

According to the exemplary embodiments described herein thus far, an IR absorption layer or an IR reflection layer is included in the structure of an image sensor. According to other exemplary embodiments, an isolation layer is disposed over the RDL as in the previously described exemplary embodiments. However, in the present exemplary embodiments, the material of which the isolation layer is formed is chosen such that it significantly absorbs IR light. Therefore, the isolation layer is multi-functional, and the need for separate isolation layers and absorption layers is eliminated.

Figure 17:
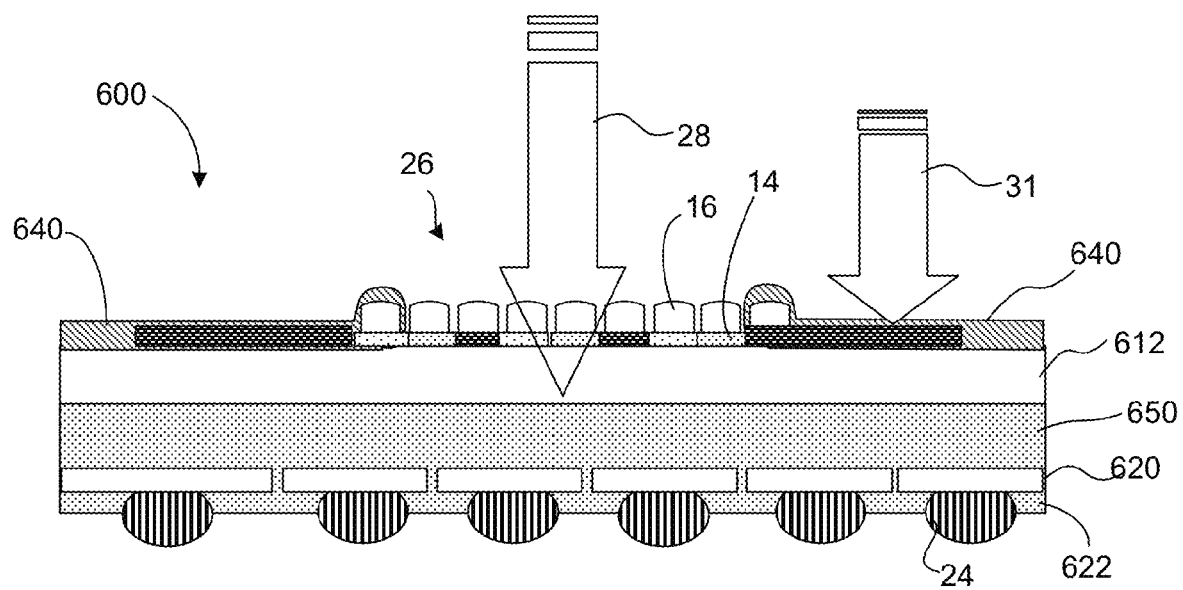
FIG. 17 includes a schematic cross-sectional diagram of an image sensor having a multi-functional isolation layer, which significantly absorbs IR light, according to some exemplary embodiments.

FIG. 17 includes a schematic cross-sectional diagram of an image sensor 600 having a multi-functional isolation layer 650, which significantly absorbs IR light, according to some exemplary embodiments. Referring to FIG. 17, various elements of image sensor 600 are the same as corresponding elements of the various image sensors described above in detail. These like elements are identified by like reference numerals. Detailed description of these like elements will not be repeated.

Referring to FIG. 17, an image sensor 600 includes an isolation layer 650 formed over an RDL 620, which is formed over a passivation layer 622. Isolation layer 650 is composed of a material that significantly absorbs IR. As a result, IR light passing through window or opening 26 into sensing layer 612 is detected and used in generating an image. However, any IR light that reaches isolation layer 650 is absorbed by isolation layer 650, such that no IR light passes back through sensing layer 612. As a result, no ghost image is produced. As an isolation layer, layer 650 provides an electric charge insulating function. As an IR absorption layer, layer 650 significantly absorbs IR to reduce or prevent ghost imaging of RDL 620.

In some exemplary embodiments, image sensor 600 also includes a BPR layer or film 640 applied to the front or top side of image sensor 600. In this embodiment, IR light 31 incident on the top or front surface of image sensor 600 in the non-active region of the device is blocked, i.e., absorbed, such that it does not enter sensing layer 612 and, therefore, does not introduce noise or degrade the image generated by image sensor 600. In image sensor 600 of FIG. 12, BPR layer or film 640 must remain open at window 26 such that IR light 28 can enter sensing layer 612 and be detected. It will be understood that, within the scope of this disclosure, image sensor 600 can include a BPR layer or film on either its back/bottom side, its front/top side, both its back/bottom side and its front/top side, or neither its back/bottom nor its front/top side.

In some exemplary embodiments, isolation layer 650 can include an organic material, such as a NIR absorbing organic compound. This isolation layer material is generally organic instead of inorganic. The advantage of a multi-functional isolation layer is that it can have a simple one-layer structure, as contrasted with other embodiments described herein that can comprise at least two layers. Therefore, the overall sensor structure of FIG. 17 can be simpler and is easier to manufacture.

In general, such NIR absorbing organic compounds are chromophores whose π electrons are effectively delocalized along a conjugated chain. Examples include polyene chromophores such as rylene and its derivatives, polymethine chromophores such as merocyanine, cyanie and hemicyanine dyes, and NIR organic compounds containing donor-acceptor (D-A) chromophores such as tetrathiafulvalene-σ-tetracyano-p-quinodimethane, a D-σ-A compound, and its derivatives. Other examples of D-A chromophores include D-π-A-π-D type, D-A-D type systems of compounds, etc. Yet other examples of NIR absorption material are compounds that are disclosed in U.S. Pat. No. 6,775,059, which is incorporated herein in its entirety by reference.

FIGS. 18A-18C are images which illustrate the results of the approaches of the exemplary embodiments used in reducing or eliminating ghost imaging, specifically ghost imaging of the RDL of an image sensor. The approaches include forming an IR reflection barrier layer between the RDL and the sensing layer and forming an IR absorption barrier layer between the RDL and the sensing layer. FIG. 18A is an image produced without any IR barrier layer. As shown in FIG. 18A, a ghost image of the RDL, showing its conductive traces and pads, is formed. FIG. 18B is an image illustrating the effects of adding an IR reflection barrier layer between the RDL and the sensing layer, such as the embodiments illustrated and described above in connection with FIGS. 5 and 6. As shown in FIG. 18B, the image of the RDL is eliminated. However, this approach may cause the sensing layer to be flooded by the reflected IR. FIG. 18C is an image illustrating the effects of adding an IR absorption barrier layer between the RDL and the sensing layer, such as the embodiments illustrated and described above in connection with FIGS. 11, 12 and 17. As shown in FIG. 18C, the image of the RDL is eliminated. Also, by comparison with FIG. 18B, it is noted that the flooding of the sensing layer is eliminated when using an IR absorption barrier layer, as evidenced by the relative darkness of the image of FIG. 18C.

Generally, the IR reflection layer tends to result in more IR reaching the sensing layer than the IR absorption layer. In a relatively strong lighting environment, the IR reflection layer may cause the sensors to be flooded by IR, thus possibly negatively impacting the detection of other wavelengths, such as those in the visible range. However, in an environment that has very little visible light and relies heavily on IR for detection, the IR reflection layer will have better detection sensitivity than the IR absorption layer, because more IR will reach the sensing layer. An example of this may be a night vision product that is intended for use in a pitch black environment.

It should be noted that in an environment where both visible and IR are important for detection, the IR absorption layer may be a better approach, because the sensor will not be flooded by IR as with the IR reflection layer. It should also be noted that, according to exemplary embodiments, both the IR reflection and the IR absorption may be implemented within the same sensor product, to better prevent IR from reaching the RDL.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

What is claimed is:

1. An image sensor, comprising:
    a photosensing element for receiving infrared (IR) radiation and detecting the IR radiation and generating an electrical signal indicative of the IR radiation;
    a redistribution layer (RDL) under the photosensing element, the RDL comprising a pattern of conductors for receiving the electrical signal; and
    an isolation layer between the photosensing element and the RDL, the isolation layer being adapted to absorb the IR radiation such that a substantial portion of the IR radiation does not impinge upon the RDL.

2. The image sensor of claim 1, wherein the isolation layer is adapted to provide electrical isolation among the conductors of the RDL.

3. The image sensor of claim 1, wherein the isolation layer comprises an organic material.

4. The image sensor of claim 1, wherein the isolation layer comprises an IR-absorbing organic compound.

5. The image sensor of claim 4, wherein the IR-absorbing organic compound is a chromophore whose π electrons are effectively delocalized along a conjugated chain.

6. The image sensor of claim 4, wherein the IR-absorbing organic compound is at least one of a polyene chromophores, a polymethine chromophore, and a NIR organic compound containing donor-acceptor (D-A) chromophores.

7. The image sensor of claim 6, wherein the polyene chromophore is one of rylene and its derivatives.

8. The image sensor of claim 6, wherein the polymethine chromophore is one of merocyanine, cyanie and hemicyanine dyes.

9. The image sensor of claim 6, wherein the NIR organic compound containing donor-acceptor (D-A) chromophores is at least one of tetrathiafulvalene-σ-tetracyano-p-quinodimethane, a D-σ-A compound, and its derivatives, and D-π-A-π-D type and D-A-D type systems of compounds.

10. The image sensor of claim 1, further comprising a layer of black photoresist over the photosensing element for absorbing radiation.

11. The image sensor of claim 10, wherein the layer of black photoresist covers a non-active region of the photosensing layer.

12. The image sensor of claim 1, further comprising a layer of black photoresist under the photosensing element for absorbing radiation.

13. The image sensor of claim 1, wherein the IR radiation is in a near infrared (NIR) wavelength range of 900-1200 nm.

* * * * *

UNITED STATES PATENT AND TRADEMARK OFFICE
CERTIFICATE OF CORRECTION

PATENT NO. : 9,184,200 B2
APPLICATION NO. : 14/696630
DATED : November 10, 2015
INVENTOR(S) : Lin et al.

Page 1 of 1

It is certified that error appears in the above-identified patent and that said Letters Patent is hereby corrected as shown below:

In the specification

Column 2, line 66, "layers" should read -- layer --;

Column 3, line 3, "layers" should read -- layer --;

Column 3, line 45, "patters" should read -- patterns --;

Column 3, line 46, "Patter" should read -- Pattern --.

Signed and Sealed this
Fifth Day of July, 2016

Michelle K. Lee
*Director of the United States Patent and Trademark Office*